(12) United States Patent
Allred

(10) Patent No.: US 6,757,396 B1
(45) Date of Patent: Jun. 29, 2004

(54) DIGITAL AUDIO DYNAMIC RANGE COMPRESSOR AND METHOD

(75) Inventor: Rustin W. Allred, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/408,097

(22) Filed: Sep. 27, 1999

Related U.S. Application Data

(60) Provisional application No. 60/108,684, filed on Nov. 16, 1998, and provisional application No. 60/109,882, filed on Nov. 25, 1998.

(51) Int. Cl.[7] .............................. H03G 7/00; H03G 3/00
(52) U.S. Cl. ....................................... 381/106; 381/107
(58) Field of Search ................................ 381/104, 106, 381/107

(56) References Cited

U.S. PATENT DOCUMENTS

| | | | |
|---|---|---|---|
| 4,535,471 A | | 8/1985 | Kuroda |
| 4,887,299 A | | 12/1989 | Cummins et al. |
| 5,255,325 A | | 10/1993 | Ishimitsu et al. |
| 5,524,060 A | | 6/1996 | Silfvast et al. |
| 5,579,404 A | * | 11/1996 | Fielder et al. ............... 381/101 |
| 5,647,026 A | | 7/1997 | Kwarta |
| 5,796,842 A | | 8/1998 | Hanna |
| 5,848,171 A | * | 12/1998 | Stockham et al. .......... 381/106 |
| 5,923,768 A | | 7/1999 | Frindle et al. |
| 6,175,634 B1 | | 1/2001 | Graumann |

OTHER PUBLICATIONS

Marina Bosi, "Low–Cost/High–Quality Digital Dynamic Range Processor", Presented at the 91st Convention of the Audio Engineering Society on Oct. 4–8, 1991, New York, pp. 1–17.

Fred Floru, "Attach and Release Time Constants In RMS–Based Compressors and Limiters", Presented at the 99th Convention of the Audio Engineering Society on Oct. 6–9, 1995, New York, pp. 1–34.

P.A. Frindle, et al., "Implementation of Dynamics Section in a Digital Console Design", Presented at the 100th Convention of the Audio Engineering Society on May 11–14, 1996, Copenhagen, pp. 1–20.

G.W. McNally, "Dynamic Range Control of Digital Audio Signals", J. Audio Eng. Society, vol. 32, No. 5, May 1984, pp. 316–327.

Jon C. Schmidt, et al., "Multichannel Dynamic Range Compression For Music Signals", Department of Electrical Engineering and Computer Science, Northwestern University, Evanston, Illinois, pp. 1013–1016.

Luzheng Lu, "A Digital Combined Limiter/Compressor for Audio Mixing", Studer Professional Audio A.G., Chatou, France, pp. 38–41.

* cited by examiner

*Primary Examiner*—Forester W. Isen
*Assistant Examiner*—Brian Tyrone Pendleton
(74) *Attorney, Agent, or Firm*—Mark Courtney; W. James Brady; Frederick J. Telecky, Jr.

(57) ABSTRACT

A digital audio dynamic range compressor includes a root mean square estimator receiving first and second audio input samples and generating root mean square values of the samples. A gain calculator receives the root mean square values and computes a gain for each input sample in the linear domain, not in the logarithmic or dB domain. A minimum selector receives the computed gain of each input sample and determines a minimum. An attack and release filter receives the minimum gain value and filters the minimum gain value according to attack and release coefficients and generate a gain output. A multiplier receives the gain output and multiplies the first and second audio input samples with the gain output.

15 Claims, 1 Drawing Sheet

DIGITAL AUDIO DYNAMIC RANGE COMPRESSOR AND METHOD

RELATED PATENT APPLICATION

This patent application claims the benefit of provisional application No. 60/108,684, titled Low Implementation Cost Dynamic Range Compressor, filed on Nov. 16, 1998; and provisional application Ser. No. 60/109,882, titled Digital Signal Processing Circuits, Systems, and Methods Implementing Approximations for a Reciprocal, filed on Nov. 25, 1998, incorporated herein by reference.

This patent application is related to co-pending non-provisional application Ser. No. 09/407,552, titled Digital Audio Dynamic Range Compressor and Method, filed on Sep. 28, 1999.

TECHNICAL FIELD OF THE INVENTION

This invention is related in general to the field of digital signal processing systems and methods, and more particularly, to a digital audio dynamic range compressor and method.

BACKGROUND OF THE INVENTION

Every audio system has a limited dynamic range to reproduce the smallest to the largest amplitudes of the input audio signal. Audio signals are often composed of low amplitude intervals combined with brief periods of high amplitudes. For example, a piece of music that contains soft vocals combined with occasional percussion instruments. Such music gives rise to a dynamic range management problem for digital audio systems because it is expensive to accommodate the full dynamic range of this type of music. Further, the quality of lower amplitude episodes can be degraded if the system is always scaled to accommodate the highest amplitude episodes. Dynamic range compression is a technique used to accommodate high-amplitude signals without seriously degrading lower amplitude signals.

Dynamic range compression systems may perform dynamic scaling so that when high-amplitude episodes are encountered, the gain of the system is scaled back to accommodate them. The system is then automatically rescaled when lower amplitude signals are present. Such dynamic range compression systems are typically costly and difficult to implement.

In high-end audio systems, the high cost and difficulty in implementation are easily justified and absorbed. However, there are segments of the market, such as personal computers and laptop computers, where dynamic range compression would greatly improve the sound quality of the system. In these applications, the high cost in implementing dynamic range compression cannot be easily absorbed.

SUMMARY OF THE INVENTION

It has been recognized that it is desirable to provide a digital audio dynamic range compression system and method that is easier and less costly to implement.

In one aspect of the invention, a digital audio dynamic range compressor includes an attribute estimator receiving an audio input sample and generating an attribute estimate of the sample. A gain calculator receives the attribute estimate and computes a gain for the audio input sample in the linear domain, not in the logarithmic or dB domain. A filter receives the gain and smooths the gain to generate a gain output. A multiplier receives the gain output and multiplies the audio input sample with the gain output.

In another aspect of the invention, a digital audio dynamic range compressor includes a root mean square estimator receiving first and second audio input samples and operable to generate root mean square values, a maximum selector receiving the root mean square values and operable to select a maximum. A gain calculator then receives the maximum root mean square value and computes a gain in the linear domain without conversion to logarithmic (dB) domain and back. The computed gain is then filtered according to attack and release coefficients and generate a gain output. The gain output is then provided to a multiplier to multiply the first and second audio input samples with the gain output.

In yet another aspect of the invention, a method of audio dynamic range compression includes the steps of receiving a left input sample and a right input sample, estimating a root mean square value of each sample, and computing a gain for each sample in the linear domain. The minimum gain is selected and filtered according to user-specified attack and release coefficients to generate a gain output. The left input sample and the right input sample are then multiplied with the gain output to generate left and right audio output samples.

A technical advantage of the invention is the significantly decreased cost associated with the implementation of the digital audio dynamic range compressor of the present invention. The modification of the system design according to the invention lowers costs, yet the minor degradation in sound quality arising from the simplification enables a certain segment of the consumer product market to cost-effectively improve the sound quality of its product offerings.

BRIEF DESCRIPTION OF THE DRAWINGS

For a better understanding of the present invention, reference may be made to the accompanying drawings, in which.

DETAILED DESCRIPTION OF THE INVENTION

Figure 1:
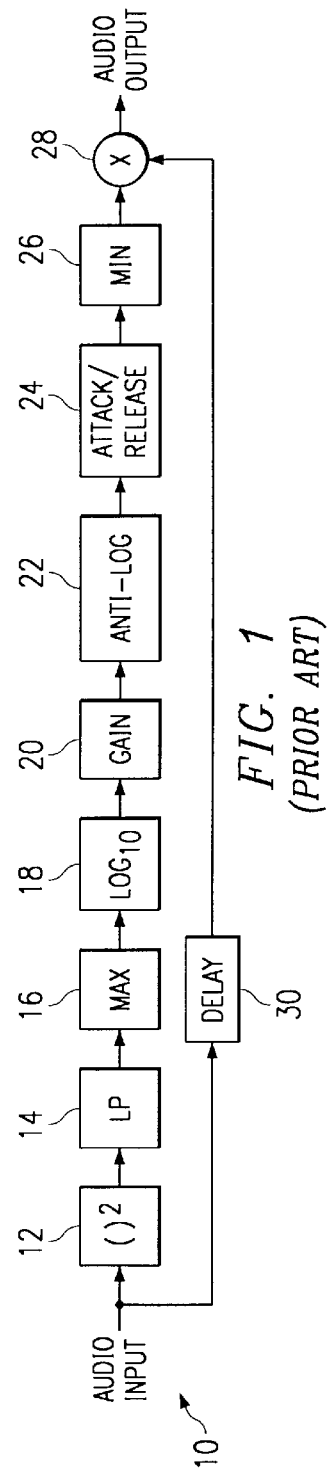
FIG. 1 is a functional block diagram of a conventional digital audio compressor.

FIG. 1 is a functional block diagram of a conventional digital audio compressor 10 of the type discussed in Lu, L., *A Digital Combined Limiter/Compressor for Audio Mixing*, Audio Engineering Society 8th Regional Convention, Tokyo, June 1997, pp. 38–41. For the sake of simplicity, only a single channel is shown in FIG. 1. Dynamic range compressor 10 includes a squarer or squaring block 12 which squares an incoming audio input signal, and a filter 14 that filters the squared signal. As shown, filter 14 may be a low pass filter (LP), such as a first order IIR filter. Squarer 12 and filter 14 provide an estimate of the root mean square (RMS) value of the incoming signal amplitude and provides an output to a maximum block or circuit 16. The maximum of the RMS values of the two channels is then selected by maximum block 16. RMS level estimation reflects the human ear perception of the loudness of the signal and the maximum describes the instantaneous amplitude of the signal.

In conventional dynamic range compressors, gain computation is done in the base 10 logarithmic (dB) domain. Therefore, the maximum value is provided to a base 10 logarithmic converter 18 which provides its dB output to a gain computation block 20. The computed gain is then converted back from the base 10 logarithmic domain to the linear space domain by an antilogarithmic circuit or functional block 22. In general, conventional systems implement the logarithmic conversion and antilogarithmic conversion with lookup tables or special logarithm computation hardware, which are costly to implement. The obtained gain value is then provided to an attack and release stage 24, which is used to control the speed or rate at which the compressor approaches and leaves the static response curve which results in gain changes that are pleasing to the ear. The output is then multiplied with the audio input signal after it has been delayed by a predetermined amount in a delay circuit or functional block 30.

Figure 2:
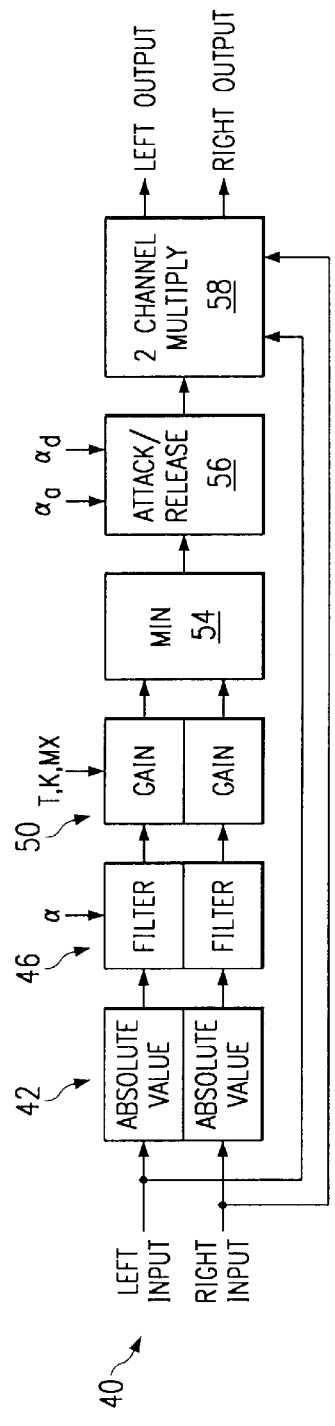
FIG. 2 is a functional block diagram of an embodiment of a digital audio dynamic range compressor and method according to the teachings of the present invention.

FIG. 2 is a functional block diagram of an embodiment of a digital audio dynamic range compressor and method 40 according to the teachings of the present invention. Dynamic range compressor 40 of the present invention requires lower cost to implement than the conventional system of the type shown in FIG. 1. Dynamic range compressor 40 is shown with both left and right channels. Dynamic range compressor 40 of the present invention comprises an RMS detector or energy estimator which includes an absolute value circuit or functional block 42 and a filter 46. In comparison, conventional systems estimate the RMS value using a squarer, which is more costly to implement than absolute value. Absolute value block 42 takes the absolute value of the left and right audio input signals. Filter 46 is preferably a first order or an alpha filter, which uses a user-specified time constant or coefficient, $\alpha$, that may be downloadable. For the simplest configuration, the value of a can be chosen to be a power of two or a canonical signed digit representation:

$$CSD = C_1 2^{-1} + C_2 2^{-2} + C_3 2^{-3} + \ldots + C_n 2^{-n}$$

Such configuration allows the use of shift and addition operations rather than multiplication. If the filter is written in the most efficient form, $$y(n) = \alpha x(n) + (1-\alpha) y(n-1)$$

may be factored as:

$$y(n) = y(n-1) + \alpha[x(n) - y(n-1)]$$

Figure 3:
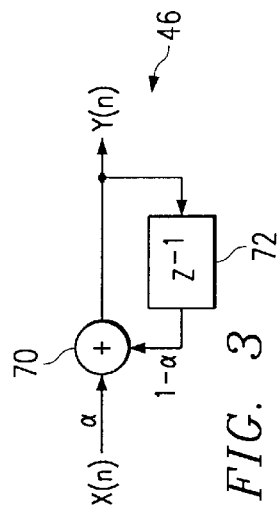
FIG. 3 is a block diagram of an exemplary alpha filter used in the present invention.

This further simplification allows the multiplication operation (or shift and addition) to be performed only once. A functional block diagram of the first order (alpha) filter is shown in FIG. 3 and described in more detail below.

A more significant departure from the conventional system of the type shown in FIG. 1 is that the gain of the present invention is computed in linear space without conversion to dB or the logarithmic domain and the subsequent antilogarithmic conversion of the computed gain. As shown in FIG. 2, the filtered RMS estimate values of both channels are provided directly to a gain computation circuit or block 50. The gain is computed by using the following algorithm:

if $I > T$ $$g = \frac{1}{K} + \frac{K-1}{KI} T$$

else $$g = 1$$

where:
g=gain in linear space,

K=user-specified compression ratio,
I=output from filter block 46 divided by MX,
T=user-specified threshold,
MX=maximum possible signal value (system-specified).

In the above equation, since K and T are both downloaded, it is preferable to configure the system such that the only division needed is for $$\frac{1}{I}$$

which is then multiplied by the downloaded constant value $$\left(\frac{K-1}{K}\right)T$$

Since division operations tend to be costly, the approximation technique described in Digital Signal Processing Checks Systems, and Methods Implementing Approximations for a Reciprocal may be used. The gain is computed in this manner for each channel, the minimum of the two gain values is then determined in block 54 and filtered in attack and release block 56 in the following manner:

if $g_c < g_o$ $$g_n = \alpha_a g_c + (1-\alpha_a) g_o$$

else $$g_n = \alpha_d g_c + (1-\alpha_d) g_o$$

where, $g_n$=new gain,
$g_c$=calculated gain from block 50,
$g_o$=old gain applied to previous sample,
$\alpha_a$=user-specified attack $\alpha$,
$\alpha_d$=user-specified decay $\alpha$.

The attack and release (decay) filters set the attack and release (delay) time constants to allow gain changes that are pleasing to the ear. The attack and release filtering of the present invention may be implemented by alpha filters.

The computed gain is then multiplied with the left audio input sample and the right audio input sample without subjecting them to delay as in conventional systems. A left audio output sample and a right audio output sample are generated.

FIG. 3 is a block diagram of an exemplary alpha filter 46 used in the dynamic range compressor of the present invention. Filter 46 includes a summer 70 and a delay block 72. An input sample, x(n) or $\alpha$, is summed with a delayed sample, 1-$\alpha$, to yield an output sample, y(n).

Constructed in this manner, the dynamic range compressor of the present invention processes audio signals in a simplified way to substantially reduce the implementation cost and difficulty. In sum, in the dynamic range compressor of the present invention, the squarer is modified to be an absolute value function for RMS estimation, the gain is computed in the linear domain without requiring logarithmic and antilogarithmic conversions, and the delay block is eliminated. Further, approximation techniques may be used instead of costly divisions. The resultant system performs dynamic range compression admirably without substantial degradation. The present invention is especially suited to particular segments of the consumer market where good sound quality is desired but where the high cost associated with conventional systems cannot be supported.

It may be noted that the present invention shown explicitly in FIG. 2 computes a gain for both channels and then selects a minimum prior to attack and release filtering. However, the present invention also encompasses those systems in which a maximum is selected after RMS estimation and prior to gain computation, so that only one gain computation is performed per sample for both channels.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A digital audio dynamic range compressor, comprising:
   an attribute estimator receiving an audio input sample and operable to estimate a predetermined attribute having an absolute value calculator receiving the first and second audio input samples and operable to compute the absolute values thereof and an alpha filter receiving the absolute values and generating $$y(n)=y(n-1)+\alpha[x(n)-y(n-1)]$$

where:
   x(n)=input to the filter,
   y(n)=output from the filter,
   α=user-specified coefficient;
   a gain calculator receiving the estimated attribute and operable to determine a gain for the audio input sample in linear domain;
   a filter receiving the gain and operable to smooth the gain; and
   a multiplier receiving the smoothed gain and operable to multiply the audio input sample with the smoothed gain.

2. The compressor, as set forth in claim 1, wherein the gain calculator is operable to compute:

if $I > T$
   $$g = \frac{1}{K} + \frac{K-1}{KI}T$$
   else
   $$g = 1$$

where:
   g=gain in linear space,
   K=user-specified compression ratio,
   I=output from filter block 46 divided by MX,
   T=user-specified threshold,
   MX=system-specified maximum possible signal value.

3. The compressor, as set forth in claim 1, wherein the filter smooths according to the following:

if $g_c < g_o$
   $$g_n = \alpha_a g_c + (1-\alpha_a)g_o$$
   else
   $$g_n = \alpha_d g_c + (1-\alpha_d)g_o$$

where, $g_n$=new gain,
   $g_c$=calculated gain from block 50,
   $g_o$=old gain applied to previous sample,
   $\alpha_a$=user-specified attack α,
   $\alpha_d$=user-specified decay α.

4. The compressor, as set forth in claim 1, wherein the attribute estimator estimates the predetermined attribute of left and right audio input samples, and the gain calculator determines the gains of both left and right audio input samples, and the filter smooths a lesser gain of the gains of the left and right audio input samples.

5. The compressor, as set forth in claim 1, wherein the attribute estimator estimates the predetermined attribute of left and right audio input samples, and the gain calculator determines the gain of a greater of the attributes of the left and right audio input samples.

6. A digital audio dynamic range compressor, comprising:
   a root mean square estimator receiving first and second audio input samples and operable to generate root mean square values thereof;
   a gain calculator receiving the root mean square values and operable to compute respective gains in the linear domain;
   a minimum selector for selecting a minimum gain from the gains computed from said gain calculator;
   an attack and release filter receiving the minimum gain and operable to filter the gain according to attack and release coefficients and generate a gain output; and
   a multiplier receiving the gain output and operable to multiply the first and second audio input samples with the gain output.

7. The compressor, as set forth in claim 6, wherein the root mean square estimator comprises:
   an absolute value calculator receiving the first and second audio input samples and operable to compute absolute values thereof; and
   an alpha filter receiving the absolute values and operable to generate:

$$y(n)=y(n-1)+\alpha[x(n)-y(n-1)]$$

where:
   x(n)=input to the filter,
   y(n)=output from the filter,
   α=user-specified coefficient.

8. The compressor, as set forth in claim 6, wherein the gain calculator is operable to compute:

if $I > T$
   $$g = \frac{1}{K} + \frac{K-1}{KI}T$$
   else
   $$g = 1$$

where:
   g=gain in linear space,
   K=user-specified compression ratio,
   I=output from filter block 46 divided by MX,
   T=user-specified threshold,
   MX=system-specified maximum possible signal value.

9. The compressor, as set forth in claim 6, wherein the attack and release filter filters according to the following:

if $g_c<g_o$ $g_n=\alpha_a g_c+(1-\alpha_a)g_o$ else $g_n=\alpha_d g_c+(1-\alpha_d)g_o$ where, $g_n$=new gain, $g_c$=calculated gain from block 50, $g_o$=old gain applied to previous sample, $\alpha_a$=user-specified attack $\alpha$, $\alpha_d$=user-specified decay $\alpha$.

10. A method of audio dynamic range compression, comprising:

receiving a left input sample and a right input sample;

estimating a root mean square value of each sample;

computing a gain for each sample in the linear domain;

selecting a minimum gain;

attack and release filtering the minimum gain according to user-specified attack and release coefficients to generate a gain output;

multiplying the left input sample with the gain output to generate a left audio output; and multiplying the right input sample with the gain output to generate a left audio output.

11. The method, as set forth in claim 10, wherein estimating the root mean square comprises:

obtaining an absolute value of each sample; and first order filtering the absolute values.

12. The method, as set forth in claim 10, wherein estimating the root mean square comprises:

obtaining an absolute value of each sample; and first order filtering the absolute values according to:

$y(n)=y(n-1)+\alpha[x(n)-y(n-1)]$ where:

x(n)=input to the filter, y(n)=output from the filter, $\alpha$=user-specified coefficient.

13. The method, as set forth in claim 10, wherein computing the gain computes:

if $I>T$ $$g=\frac{1}{K}+\frac{K-1}{KI}T$$

else $g=1$ where:

g=gain in linear space,

K=user-specified compression ratio,

I=output from filter block 46 divided by MX,

T=user-specified threshold,

MX=system-specified maximum possible signal value.

14. The method, as set forth in claim 10, wherein attack and release filtering computes:

if $g_c<g_o$ $g_n=\alpha_a g_c+(1-\alpha_a)g_o$ else $g_n=\alpha_d g_c+(1-\alpha_d)g_o$ where, $g_n$=new gain, $g_c$=calculated gain from block 50, $g_o$=old gain applied to previous sample, $\alpha_a$=user-specified attack $\alpha$, $\alpha_d$=user-specified decay $\alpha$.

15. A digital audio dynamic range compressor, comprising:

an attribute estimator receiving an audio input sample and operable to estimate a predetermined attribute thereof;

a gain calculator receiving the estimated attribute and operable to determine a gain for the audio input sample in linear domain; wherein the gain calculator is operable to compute:

if $I>T$ $$g=\frac{1}{K}+\frac{K-1}{KI}T$$

else $g=1$ where:

g=gain in linear space,

K=user-specified compression ratio,

I=output from filter block 46 divided by MX,

T=user-specified threshold,

MX=system-specified maximum possible signal value, and wherein the gain computation is approximated by receiving and multiplying a constant $$\left(\frac{K-1}{KI}\right)T$$

with $$\frac{1}{I}$$

by a digital signal system comprising:

an input for receiving a signal;

circuitry for measuring an attribute of the signal, wherein the attribute relates at least in part to the value of I;

circuitry for identifying a bounded region within which I falls, wherein the bounded region is one of a plurality of bounded regions and wherein each bounded region has a corresponding slope value and first and second endpoints; and circuitry for determining the approximate reciprocal by adjusting a reciprocal value at one of the first and second endpoints by a measure equal to a distance of the value of I from the one of the first and second endpoints times the slope value corresponding to the bounded region within which I is identified as falling.

* * * * *